United States Patent
Sakai et al.

[11] Patent Number: 5,857,474
[45] Date of Patent: Jan. 12, 1999

[54] METHOD OF AND APPARATUS FOR WASHING A SUBSTRATE

[75] Inventors: Takamasa Sakai; Sadao Hirae; Minobu Matsunaga, all of Kyoto, Japan

[73] Assignee: Dainippon Screen Mfg. Co., Ltd., Japan

[21] Appl. No.: 766,579

[22] Filed: Dec. 12, 1996

[30] Foreign Application Priority Data

Dec. 28, 1995 [JP] Japan .................................. 7-343147

[51] Int. Cl.⁶ ................................................ B08B 3/10
[52] U.S. Cl. ...................... 134/102.3; 134/105; 134/153; 134/902
[58] Field of Search ........................ 134/105, 108, 134/147, 153, 104.2, 4, 25.4, 102.1, 102.3, 902

[56] References Cited

U.S. PATENT DOCUMENTS

| 4,491,484 | 1/1985 | Williams | 134/4 |
| 4,883,775 | 11/1989 | Kobayashi | 134/4 |

FOREIGN PATENT DOCUMENTS

| 62-213127 | 9/1987 | Japan | 134/102.1 |
| 3-23635 | 1/1991 | Japan | 134/902 |
| 3-30315 | 2/1991 | Japan | 134/902 |
| 3-131026 | 6/1991 | Japan | 134/902 |
| 3-234021 | 10/1991 | Japan | 134/902 |
| 3-261142 | 11/1991 | Japan | 134/4 |
| 4-171818 | 6/1992 | Japan . | |
| 4-188828 | 7/1992 | Japan . | |
| 5-144793 | 6/1993 | Japan . | |
| 6-208098 | 7/1994 | Japan | 134/102.1 |

OTHER PUBLICATIONS

European Patent Office (EPO) 428,983, May 1991.
W.T. McDermott, et al., "Removing Submicron Surface Particles Using a Cryogenic Argon–Aerosol Technique", *Microcontamination*, Oct. 1991, pp. 33–36, 94 and 95.
Catalog of "Eco–Snow" of Hughes Aircraft Company, 1994.

*Primary Examiner*—Frankie L. Stinson
*Attorney, Agent, or Firm*—Ostrolenk, Faber, Gerb & Soffen, LLP

[57] ABSTRACT

A substrate washing apparatus includes a cooling system for cooling a substrate to below zero, a wet gas supplying system for supplying a gas containing atomized water to the surface of the substrate cooled by the cooling means to form ice on the surface of said substrate, and an ice removing unit for removing the ice formed on the surface of the substrate. This apparatus removes not only relatively large particles but also fine particles from the substrate.

20 Claims, 3 Drawing Sheets

METHOD OF AND APPARATUS FOR WASHING A SUBSTRATE

BACKGROUND OF THE INVENTION

This invention relates to a method of and an apparatus for washing a substrate such as semiconductor wafer, glass substrate for liquid crystal, and substrate for photomask.

A brush scrub method has been generally used to remove particles such as dust attached to the surface of a substrate. According to this method, particles are removed by rubbing the surface of the substrate placed on a rotary substrate support by a nylon brush or the like while wash water is supplied to the surface of the substrate.

In the brush scrub method, however, there has been the problem that particles having been removed from the surface of a substrate, e.g., an oxide layer of a semiconductor wafer, are liable to reattach to the substrate due to electrostatics produced on the surface of the substrate by friction of the brush and the surface.

Also, particles attach to the brush due to the electrostatics produced by the friction. Accordingly, there is the problem that attached particles are liable to attach to a new substrate.

Further, dust is generated by bristles of the brush by rubbing the substrate by the brush. This causes the brush to be a source of dust.

Relatively large particles, having a diameter of about 0.3 $\mu$m, can be removed by the brush scrub method. However, it is difficult to remove fine particles having a diameter of about 0.1 $\mu$m because they pass between the bristles of the brush.

These problems have occurred in production of a variety of substrates such as semiconductor wafers, glass substrates for liquid crystals, and substrates for photomasks.

SUMMARY OF THE INVENTION

It is an object of the present invention to provide a method of and an apparatus for washing a substrate which have overcome the problems in the prior art.

It is another object of the present invention to provide a substrate washing method and a substrate washing apparatus which can securely remove not only relatively large particles but also fine particles from the surface of a substrate.

The present invention is directed to a method of washing a substrate, comprising the steps of: cooling a substrate to below zero; forming ice on a surface of the substrate by supplying a gas containing atomized water to the surface of the substrate cooled to below zero; and removing the ice formed on the surface of the substrate.

The substrate may be cooled to below zero by placing the substrate on a cooling plate cooled to below zero.

The ice may be removed by ejecting a gas onto the surface of the substrate at a high pressure. Further, the substrate may be preferably rotated during the ejection of the high pressure gas. Furthermore, it may be preferable to spray pure water to the surface of the substrate after the ice is removed by the high pressure gas.

Nitrogen gas may be used as a gas containing atomized water.

According to the method of the present invention, upon supplying the gas containing atomized water to the surface of the substrate cooled to below zero, ice is formed around particles as condensation nuclei. The particles are removed by removing the ice, thereby assuring reliable washing of the substrate.

The substrate is placed on the cooling plate cooled to below zero. The heat of the substrate is transferred to the cooling plate, with the result that the substrate is cooled to below zero. Accordingly, the substrate can be cooled for a shorter time in a simpler construction.

The high pressure gas is ejected onto the surface of the substrate. Accordingly, the ice is separated from the surface of the substrate by the ejected high pressure gas, thereby eliminating the ice containing particles from the substrate more reliably.

The spray of pure water after the ice has been removed increases the cleanness of the substrate.

Also, the present invention is directed to an apparatus for washing a substrate, comprising: cooling means for cooling a substrate to below zero; wet gas supply means for supply a gas containing atomized water to the surface of the substrate cooled by the cooling means to form ice on the surface of the substrate; and ice removing means for removing the ice formed on the surface of the substrate.

The cooling means may be provided with a cooling plate on which the substrate is placed; and a tube provided in the cooling plate for flowing a cooling medium. The cooling medium may be preferably liquefied nitrogen.

The wet gas supply means may be constructed by a nitrogen gas supplier for supplying nitrogen gas; a pure water mist supplier for supplying mist of pure water; and a mixer for mixing the nitrogen gas with the mist of pure water.

The ice removing means may be provided with a high pressure gas ejector. Further, the ice removing means may be provided with a rotary support for supporting the substrate, and a driver for rotating the rotary support. Furthermore, the ice removing means may be provided with a pure water supplier for supplying pure water to the surface of the substrate.

The substrate washing apparatus may be further provided with an enclosure housing for enclosing the cooling means and the substrate, and a vacuum device for evacuating the inside of the enclosure housing. Further, the substrate washing apparatus may be provided with a drying gas supplier for supplying a drying gas into the enclosure housing.

In the substrate washing apparatus, the cooling means cools the substrate placed thereon to below zero. The supply of the gas containing atomized water to the substrate cooled to below zero causes formation of ice around particles as condensation nuclei. The ice is removed by the ice removing unit. Accordingly, not only larger particles but also fine particles can be removed from the substrate more reliably and simply.

The cooling means includes the cooling plate. The cooling plate is cooled to below zero by supplying the cooling medium via the tube provided therein. Accordingly, the substrate can be cooled for a shorter time.

The wet gas supply means is provided with the mixer for mixing pure water mist and nitrogen. This enables the substrate to be reliably washed without giving any adverse influence to the substrate.

The ice removing means is provided with the high pressure gas ejector. The gas is ejected onto the surface of the substrate at the high pressure. This can separate the ice from the surface of the substrate more efficiently.

The substrate is placed and cooled in the enclosure housing. Accordingly, the substrate can be cooled more efficiently. Also, the inside of the enclosure housing is made vacuous and the drying gas is supplied. This can prevent ice from forming on the inner walls of the enclosure housing due to the humidity in the enclosure housing.

These and other objects, features and advantages of the present invention will become more apparent upon a reading of the following detailed description and accompanying drawings.

DETAILED DESCRIPTION OF THE PREFERRED EMBODIMENTS OF THE INVENTION

Figure 1:
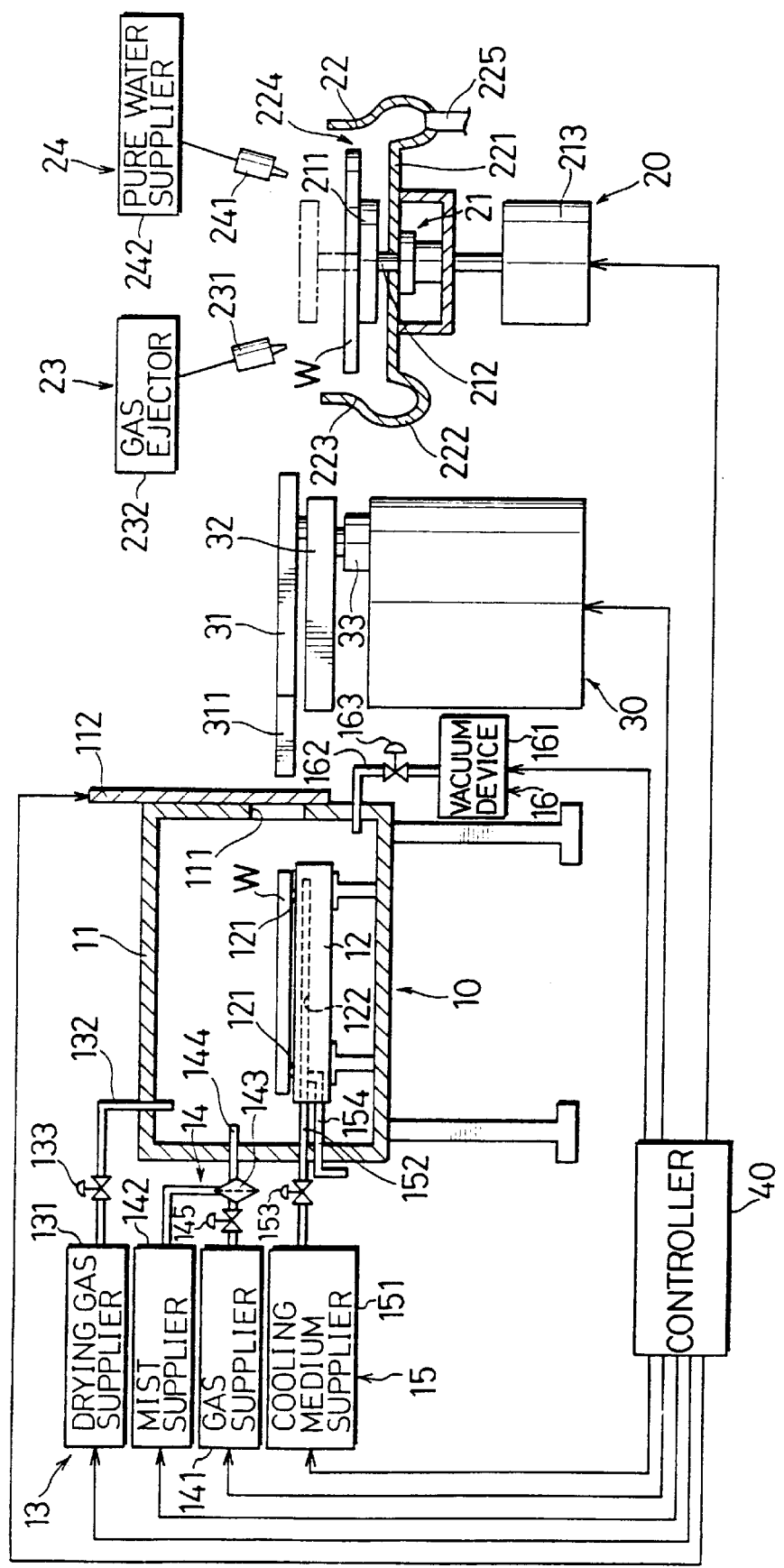
FIG. 1 is a schematic diagram showing a construction of a substrate washing apparatus embodying the present invention.

FIG. 1 is a schematic diagram showing a construction of a substrate washing apparatus embodying the invention. The substrate washing apparatus is adapted for washing a substrate such as semiconductor wafer. The apparatus includes an ice forming unit 10 for cooling a substrate W to below zero to form ice on the surface of the substrate W, an ice removing unit 20 for removing the ice formed on the surface of the substrate W, a substrate transferring unit 30 for taking the substrate W out of a substrate cassette and conveying it to the ice forming unit 10, and taking the substrate W having ice formed on its surface out of the ice forming unit 10 and transferring it to the ice removing unit 20, and a controller 40 for controlling the operations of the respective units.

The ice forming unit 10 includes an enclosure housing 11 having a heat insulation construction, and a cooling plate 12 disposed in the enclosure housing 11 and adapted to cool the substrate W to below zero when the substrate W is placed thereon.

The enclosure housing 11 is formed at one side wall thereof with an opening 111 used to take the substrate W in and out of the enclosure housing 11. Also, a door 112 is provided near the opening 111 to open and close the opening Further, the enclosure housing 11 is provided with a drying gas supplying system 13 for supplying drying gas such as nitrogen gas into the enclosure housing 11 to discharge the humidity inside the enclosure housing 11 to the outside, a wet gas supplying system 14 for supply wet gas such as nitrogen gas containing atomized water into the enclosure housing 11, a cooling medium supplying system 15 for supplying a cooling medium such as liquefied nitrogen to the cooling plate 12, and a vacuuming system 16 for making the inside of the enclosure housing 11 vacuous.

The cooling plate 12 is made of metal such as aluminum and is disposed at a lower portion in the enclosure housing 11, spaced apart from the walls of the enclosure housing 11. The cooling plate 12 is formed on its upper surface with a plurality of projections 121 for slightly distancing the substrate W from the upper surface thereof, and a tube 122 for conveying the cooling medium is provided in a zigzag manner on the cooling plate 12.

The projections 121 are mainly provided in order to prevent the attachment of dust or the like on the surface of the cooling plate 12 to the substrate W when the substrate W is placed on the cooling plate 12. In addition to the above purpose, the projections 121 act to prevent the substrate W from experiencing a drastic temperature change. However, it is not essential to provide the projections 121.

The drying gas supplying system 13 connected with the enclosure housing 11 includes a gas supplier 131 in the form of a cylinder in which compressed nitrogen gas is contained, a tube 132 for supplying the drying gas into the enclosure housing 11 from the drying gas supplier 131, and a control valve 133 disposed in the tube 132 for controlling the supply of the drying gas. The drying gas supplying system 13 is provided in order to prevent ice from forming on the inner walls of the enclosure housing 11 due to the humidity in the enclosure housing 11.

The wet gas supplying system 14 includes a gas supplier 141 in the form of a cylinder for containing compressed nitrogen gas, a mist supplier 142 for supplying mist of pure water, a mixing chamber 143 for mixing the mist of water with the gas, and a tube 144 for supplying the gas containing the atomized water into the enclosure housing 11 from the mixing chamber 143. A control valve 145 for controlling the supply of the gas is disposed before the mixing chamber 143. The mist supplier 142 is constructed by the same principle as usual atomizers, and has an unillustrated tank for containing pure water, a pump for applying a pressure to the pure water, and a spray nozzle for atomizing and spraying the pure water. Ice is formed on the surface of the substrate W cooled to below zero by the gas containing the atomized water from the wet gas supplying system 14.

Figure 2:
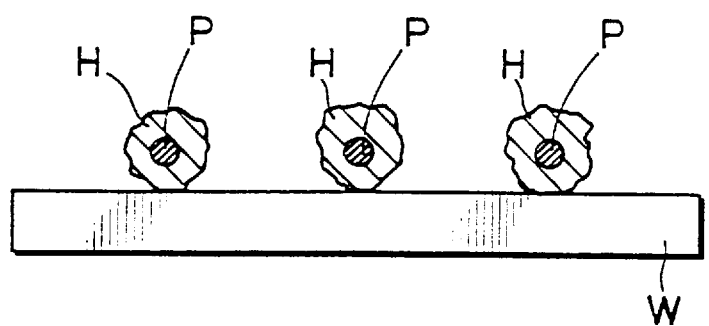
FIG. 2 is a diagram showing ice pieces formed on the surface of a substrate.

More specifically, when the gas containing the atomized water supplied into the enclosure housing 11 reaches the surface of the substrate W cooled to below zero, pieces of ice H are so produced as to enclose particles P on the substrate W as condensation nuclei as shown in FIG. 2. It should be appreciated that not only relatively large particles but also fine particles having a diameter of about 0.1 $\mu$m can be condensation nuclei. Accordingly, ice pieces H can be produced around the fine particles, too.

The cooling medium supplying system 15 includes a medium supplier 151 in the form of a cylinder for containing a cooling medium such as liquefied nitrogen, a tube 152 for supplying the cooling medium from the medium supplier 151 to the cooling plate 12 inside the enclosure housing 11, a control valve 153 disposed in the tube 152 for controlling the supply of the cooling medium, and a tube 154 for discharging the cooling medium from the cooling plate 12 to the outside. The tube 152 is connected with the inlet of the tube 122 of the cooling plate 12, whereas the tube 154 is connected with the outlet of the tube 122. The cooling plate 12 is cooled to below zero by the cooling medium supplying system 15, thereby cooling the substrate W placed thereon to below zero. The cooling plate 12 is cooled to about −40° C., but the cooling temperature for the substrate W may be higher than that.

The vacuuming system 16 includes a vacuum device 161 such as a vacuum pump, a tube 162 for discharging the nitrogen gas from the enclosure housing 11, and a control valve 163 disposed in the tube 162 for controlling the discharge of the gas. The vacuuming system 16 is provided to make the inside of the enclosure housing 11 vacuous by discharging the gas from the inside of the enclosure housing 11. Similar to the drying gas supplying system 13, the vacuuming system 16 acts to prevent the inner wall surfaces of the enclosure housing 11 from being frozen.

The ice removing unit 20 is provided with a substrate supporter 21 including a substrate support 211 on which the substrate W is to be placed, a flat annular cup 22 having an open top which forms a specified operation space for the substrate W by surrounding the substrate support 211, a gas ejecting unit 23 for blowing the pieces of ice on the surface of the substrate W away by ejecting gas such as clean air at a high pressure to the substrate W placed on the substrate support 211, and a pure water supplying unit 24 for supplying pure water for final wash of the substrate W on the substrate support 211.

The substrate supporter 21 includes a support shaft 212 which extends vertically through the bottom center of the annular cup 22 and supports the substrate support 211 at its upper end, and a moving mechanism 213 provided at the bottom end of the support shaft 212. The moving mechanism 213 includes a driver having unillustrated motor and gears, and is adapted to rotate the substrate support 211 and move it upward and downward by activating the driver.

The substrate support 211 is provided with a suction holder for securely holding the substrate W placed on its upper surface by suction. When the substrate support 211 is moved upward by the moving mechanism 213 to an upper position, where it projects above the annular cup 22, the substrate W is placed on the substrate support 211. Further, when the substrate support 211 is moved downward to a lower position inside the annular cup 22 by the moving mechanism 213, an ice removing operation or the like is performed.

The annular cup 22 includes a bottom plate 221, an annular groove 222 extending along the outer periphery of the bottom plate 221, and an annular barrier 223 projecting obliquely upward and inward from the outer edge of the annular groove 222. The bottom of the annular groove 222 is located lower than the bottom plate 221, and the upper edge of the annular barrier 223 is located higher than the bottom plate 221. As a result, a substrate accommodation space 224 surrounded by the annular barrier 223 is defined above the bottom plate 221, and the ice removing operation or the like is performed in this space 224. Further, a drain pipe 225 is connected with the annular groove 222 in a specified position to discharge the removed ice or the like to the outside.

The gas ejecting unit 23 includes a nozzle 231 for crushing the pieces of ice on the surface of the substrate W by ejecting the clean air at a high pressure to the surface of the substrate W on the rotary substrate support 211 and for removing the crushed ice from the surface of the substrate W by blowing it away, and an ejector 232 for ejecting the clean air at a high pressure through the nozzle 231.

The pure water supplying unit 24 includes a nozzle 241 for spraying pure water to the surface of the substrate W on the rotary substrate support 211 for final wash after the pieces of ice are removed from the surface of the substrate W by the gas ejecting unit 23, and a pure water supplier 242 for supplying the pure water.

The substrate transferring unit 30 is arranged between the ice forming unit 10 and the ice removing unit 20. The substrate transferring unit 30 is provided with an arm 31, a first driving device 32 including unillustrated motor and gears for linearly moving the arm 31 and driving the clamp 311, and a second driving device 33 including unillustrated motor and gears for rotating the arm 31. The arm 31 is formed at its leading end with a clamp 311 for holding the outer edges of the substrate W.

The substrate transferring unit 30 takes the substrate W from the unillustrated substrate cassette while holding the outer edges thereof by the clamp 311, and places the substrate W on the cooling plate 12 in the enclosure housing 11 of the ice forming unit 10. Further, the substrate transferring unit 30 takes the substrate W having pieces of ice formed on its surface out of the enclosure housing 11 of the ice forming unit 10 and places it on the substrate support 211 of the ice removing unit 20. After the completion of the washing, the substrate transferring unit 30 takes the substrate W out of the ice removing unit 20 and accommodates it in an unillustrated washed substrate cassette.

The controller 40 includes unillustrated CPU and ROM, and centrally controls the operation of the ice forming unit 10, the ice removing unit 20 and the substrate transferring unit 30 in accordance with a predetermined washing process in order to wash the substrate W.

Figure 3:
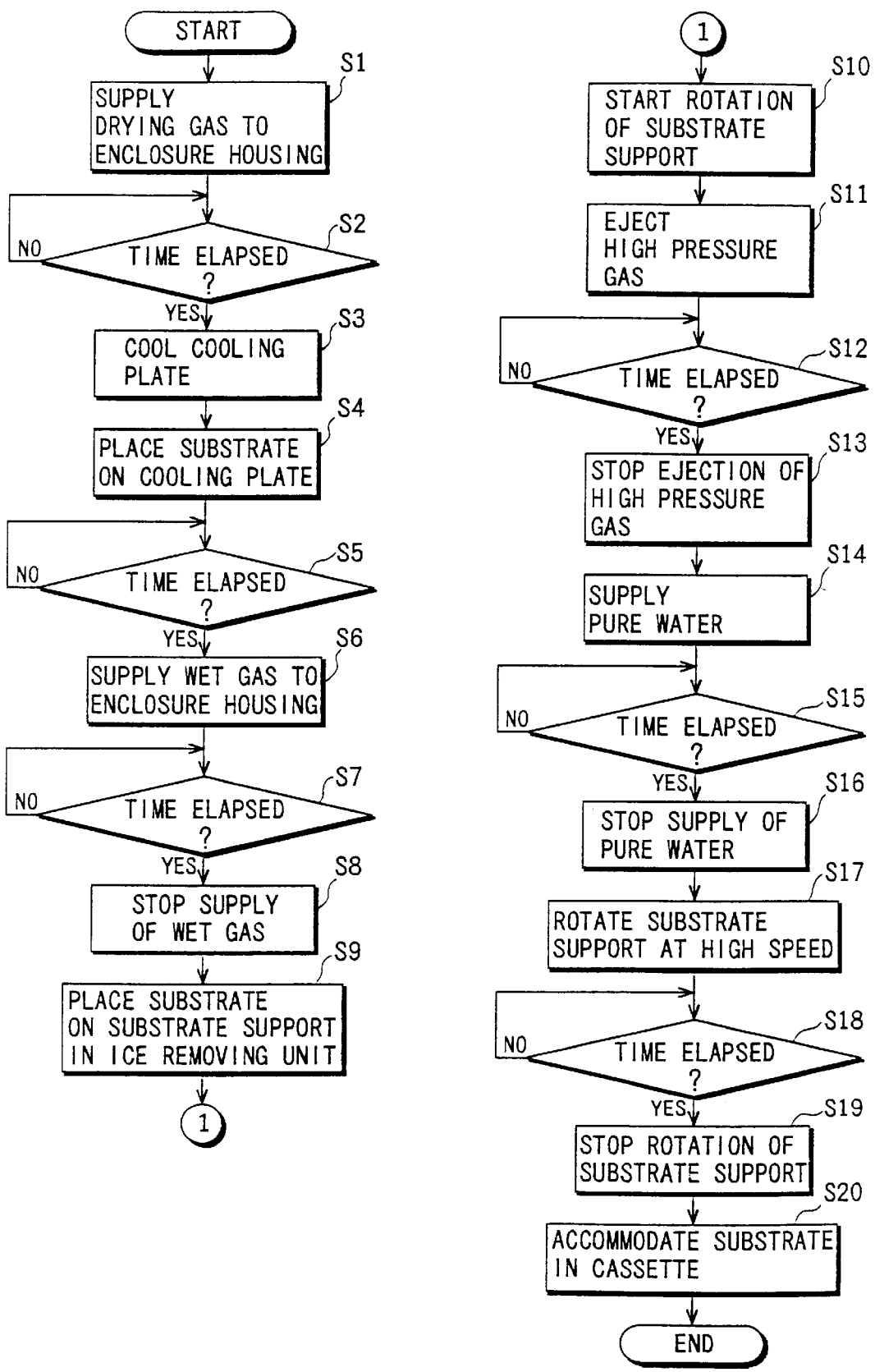
FIG. 3 is a flowchart showing an operation sequence of the substrate washing apparatus.

A washing operation sequence of the substrate washing apparatus is described with reference to a flowchart of FIG. 3.

First, the drying gas is supplied from the drying gas supplying system 13 to the enclosure housing 11 of the ice forming unit 10 (Step S1). It is then discriminated whether a predetermined drying gas supply period has elapsed after the start of the supply of the drying gas (Step S2). Upon the lapse of the drying gas supply period (YES in Step S2), the supply of the drying gas is stopped, and the cooling medium or liquefied nitrogen is supplied into the tube 122 of the cooling plate 12 from the cooling medium supplier 151 of the cooling medium supplying system 15, thereby cooling the cooling plate 12 to a predetermined temperature, e.g., $-40°$ C. (Step S3).

Subsequently, the door 122 of the enclosure housing 11 of the ice forming unit 10 is opened; the substrate W is taken out of the substrate cassette by being held by the clamp 311 of the substrate transferring unit 30 and is placed on the cooling plate 12 inside the enclosure housing 11 by the linear movement of the arm 31 through the opening 111; and then the door 112 is closed (Step S4). It is then discriminated whether a predetermined cooling period has elapsed after the substrate W is placed on the cooling plate 12 (Step S5). This cooling period is set at a value necessary for the substrate W to be cooled to below zero by the cooling plate 12.

Upon the lapse of the predetermined cooling period, the gas supplier 141 and the mist supplier 142 of the wet gas supplying system 14 are operated and a gas containing atomized water is supplied into the enclosure housing 11 from the mixing chamber 143 (Step S6). This gas may be clean air instead of an inert gas such as a nitrogen gas.

Subsequently, it is discriminated whether a predetermined gas supply period has elapsed after the start of the supply of the gas containing the atomized water (Step S7). This supply period is set at a value necessary for the pieces of ice H as shown in FIG. 2 to be formed. By the supply of this gas, the pieces of ice H, as shown in FIG. 2, are formed on the surface of the substrate W.

Upon the lapse of the predetermined gas supply period (YES in Step S7), the supply of the atomized water containing gas into the enclosure housing 11 is stopped (Step S8). Thereafter, the door 112 of the enclosure housing 11 is opened; the substrate W on the cooling plate 12 is held and taken out by the clamp 311 of the substrate transferring unit 30, and is placed on the substrate support 211 having moved to the upper position of the ice removing unit 20 by the rotating and linear movements of the arm 31 (Step S9).

Subsequently, the door 112 of the enclosure housing 11 is closed, and the wet gas inside the enclosure housing 11 is discharged to the outside by the vacuuming system 16. The substrate support 211 holding the substrate W thereon by suction is moved to its lower position by the moving mechanism 213 and then rotated at a specified speed (Step S10).

Subsequently, the ejector 232 of the gas ejecting unit 23 ejects the clean air to the substrate W at a high pressure through the nozzle 231 (Step S11). At this stage, the nozzle 231 is moved by the driver within a range defined between the center and the outer edge of the rotating substrate W to eject a highly pressurized gas to the entire substrate W. Thereby, the pieces of ice H formed on the surface of the substrate W are blown away, with the result that all pieces of ice H are removed from the surface of the substrate W. Since the particles P having attached to the surface of the substrate W are sealed up as condensation nuclei in the ice, they are removed from the surface of the substrate W by the removal of the ice. As a result, the substrate W is washed. The removed ice is caught in the annular cup 22 and is discharged to the outside through the drain pipe 225.

It is then discriminated whether a predetermined ejection period has elapsed after the start of the gas ejection to the substrate W (Step S12). The ejection period is set at a value necessary to remove the ice from the surface of the substrate W by the gas ejected at a high pressure. Upon the lapse of the predetermined ejection period (YES in Step S12), the gas ejection is stopped (Step S13), and the pure water supplier 242 of the pure water supplying unit 24 supplies pure water to the surface of the rotating substrate W via the nozzle 241 (Step S14). It is then discriminated whether a predetermined pure water supply period has elapsed after the start of the supply of the pure water (Step S15). Upon the lapse of the predetermined water supply period (YES in Step S15), the supply of the pure water is stopped (Step S16), thereby completing the final wash for the surface of the substrate W. Subsequently, the rotating speed of the substrate support 211 is switched to a high speed (Step S17). This high speed rotation removes the pure water depositing on the substrate W from the substrate W by the action of a centrifugal force, thereby drying the surface of the substrate W.

It is then discriminated whether a predetermined high rotation period has elapsed after the rotating speed of the substrate support 211 was switched to a high speed (Step S18). This high rotation period is set at a value necessary to dry the surface of the substrate W by completely removing the pure water. Upon the lapse of the high rotation period (YES in Step S18), the rotation of the moving mechanism 213 is stopped and the substrate support 211 consequently comes into stop (Step S19). In this way, a series of washing operations are completed.

Finally, the substrate support 211 is moved to its upper position by the moving mechanism 213, and the suction holder is brought to its inoperative state. In this position, the substrate W is held and taken out by the clamp 311 of the substrate transferring unit 30, and is then accommodated in the unillustrated washed substrate cassette by the rotating and linear movements of the arm 31 (Step S20).

In the above substrate washing apparatus, while the ice formed on the surface of one substrate W is removed in the ice removing unit 20, a next substrate W is placed in the enclosure housing 11 of the ice forming unit 10 so that a plurality of substrates W can be continuously washed by successively performing the respective operation steps. The cooling medium supplying system 15 may be continuously operated during the operation of the substrate washing apparatus or intermittently operated each time a new substrate W is placed in the enclosure housing 11.

The ice removing unit 20 may be constructed without the adoption of high pressure gas ejection. For example, the ice may be separated from the surface of the substrate W by applying ultrasonic waves and eliminated by the action of a centrifugal force resulting from the rotation of the substrate support 211.

Further, the substrate transferring unit 30 may have two arms 31 so that, while the substrate W having pieces of ice formed thereon is taken out of the enclosure housing 11 by one arm 31, a next substrate W can be taken out of the substrate cassette by the other arm 31. The substrate transferring unit 30 may be constructed by a combination of the arm 31 and a conveyance belt. Furthermore, the series of washing operations may be performed within one enclosed space.

According to the invention, since the ice is formed around the particles as condensation nuclei, the removal of fine particles which is impossible in the conventional brush scrub method can be made possible. Further, the reattachment of the removed particles to the substrate due to electrostatics produced by the brush, the action of the brush itself as a source of dust, or other problems in the conventional brush scrub method can be advantageously eliminated.

The inventive substrate washing method includes cooling the substrate to below zero, forming ice on the surface of the substrate by supplying a gas containing atomized water to the surface of the substrate cooled to below zero, and removing the ice formed on the surface of the substrate. Accordingly, not only relatively large particles, but also fine particles can be removed.

Since the cooling step is performed by placing the substrate on the cooling plate cooled to below zero, the substrate can be cooled to below zero within a short period of time.

Further, since the ice removing step is performed by eliminating the ice from the surface of the substrate by the gas ejected at a high pressure, the ice can be securely separated from the surface of the substrate, i.e., the ice containing particles can be securely eliminated from the surface of the substrate.

The inventive substrate washing apparatus includes the cooling system for cooling a substrate to below zero, the wet gas supplying system for supplying a gas containing atomized water to the surface of the substrate cooled by the cooling system, and the ice removing unit for removing the ice formed on the surface of the substrate by the supply of the gas by the wet gas supply system. Accordingly, not only relatively large particles, but also fine particles can be removed.

Since the cooling system includes the cooling plate on which the substrate is placed and the tube provided in the cooling plate for supplying the cooling medium, the substrate can be cooled to below zero within a short period of time.

Further, since the wet gas supplying system includes the mixing chamber for mixing the atomized water and the gas, the ice can be easily formed with the particles as condensation nuclei.

Further, since the ice removing unit is provided with the gas ejector, the ice can be securely separated from the surface of the substrate, i.e., the ice containing particles can be securely eliminated from the surface of the substrate.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. An apparatus for cleaning a substrate, comprising:
    cooling means for cooling said substrate to below zero;

wet gas supply means for supplying a gas containing atomized water to the surface of said substrate cooled by the cooling means to form ice on the surface of said substrate; and ice removing means for removing the ice in a solid form, said ice having formed on the surface of said substrate.

2. An apparatus according to claim 1, wherein said cooling means includes:

a cooling plate on which said substrate is placed; and a tube provided in the cooling plate for conveying a cooling medium.

3. An apparatus according to claim 2, wherein said cooling medium is liquefied nitrogen.

4. An apparatus according to claim 3, wherein said wet gas supply means supplies nitrogen gas containing atomized water.

5. An apparatus according to claim 4, wherein said wet gas supply means includes:

a nitrogen gas supplier for supplying nitrogen gas;

a pure water mist supplier for supplying mist of pure water; and a mixer for mixing said nitrogen gas with said mist of pure water.

6. An apparatus according to claim 5, wherein said ice removing means includes a high pressure gas ejector.

7. An apparatus according to claim 6, wherein said ice removing means further includes:

a rotary support for supporting said substrate; and a driver for rotating said rotary support.

8. An apparatus according to claim 7, wherein said ice removing means further includes a pure water supplier for supplying pure water to the surface of said substrate.

9. An apparatus according to claim 1, wherein said wet gas supply means supplies nitrogen gas containing atomized water.

10. An apparatus according to claim 9, wherein said wet gas supply means includes:

a nitrogen gas supplier for supplying nitrogen gas;

a pure water mist supplier for supplying mist of pure water; and a mixer for mixing said nitrogen gas with said mist of pure water.

11. An apparatus according to claim 1, wherein said ice removing means includes a high pressure gas ejector.

12. An apparatus according to claim 1, further comprising:

an enclosure housing for enclosing said cooling means and said substrate; and a vacuum device for making the inside of said enclosure housing vacuous.

13. An apparatus according to claim 12, further comprising a drying gas supplier for supplying a drying gas into the enclosure housing.

14. An apparatus for cleaning a substrate, comprising:

cooling means for cooling said substrate to below zero in an enclosure;

wet gas supply means for supplying a gas containing atomized water to the surface of said substrate cooled by the cooling means to form ice on the surface of said substrate; and ice removing means provided outside of said enclosure for removing the ice formed on the surface of said substrate.

15. The apparatus for cleaning a substrate as defined in claim 14, wherein said cooling means includes:

a cooling plate on which said substrate is placed; and a tube provided in the cooling plate for conveying a cooling medium.

16. The apparatus for cleaning a substrate as defined in claim 15, wherein said cooling medium is liquified nitrogen.

17. The apparatus for cleaning a substrate as defined in claim 10, wherein said wet gas supply means supplies nitrogen gas containing atomized water.

18. The apparatus for cleaning a substrate as defined in claim 17, wherein said wet gas supply means includes:

a nitrogen gas supplier for supplying nitrogen gas;

a pure water mist supplier for supplying mist of pure water; and a mixer for mixing said nitrogen gas with said mist of pure water.

19. The apparatus for cleaning a substrate as defined in claim 14, wherein said wet gas supply means supplies nitrogen gas containing atomized water.

20. An apparatus for cleaning a substrate, comprising:

cooling means for cooling said substrate to below zero;

wet gas supply means for supplying a gas containing atomized water to the surface of said substrate cooled by the cooling means to form ice on the surface of said substrate;

ice removing means for removing the ice formed on the surface of said substrate; and a transferring unit for transferring said substrate from the cooling means to the ice removing means.

* * * * *